United States Patent
Aoyama

(10) Patent No.: US 7,398,331 B2
(45) Date of Patent: Jul. 8, 2008

(54) PERIPHERAL APPARATUS, FIRMWARE UPDATING METHOD THEREOF FOR DETERMINING WHETHER AN ERROR HAS OCCURRED DURING THE INSTALLATION OF A REWRITE OPERATION

(75) Inventor: Naoki Aoyama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 439 days.

(21) Appl. No.: 10/900,171

(22) Filed: Jul. 28, 2004

(65) Prior Publication Data
US 2005/0036348 A1    Feb. 17, 2005

(30) Foreign Application Priority Data
Aug. 8, 2003    (JP)    ............................. 2003-290593

(51) Int. Cl.
G06F 3/00    (2006.01)
G06F 13/00    (2006.01)

(52) U.S. Cl. ............................... 710/8; 710/10; 710/15; 710/62; 717/173; 717/174; 717/178; 358/1.14; 358/1.15; 713/1; 713/2; 714/5; 714/44

(58) Field of Classification Search ...................... 710/8, 710/10, 15, 62; 717/173, 174, 178; 358/1.15, 358/1.14; 713/1, 2; 714/5, 44
See application file for complete search history.

(56) References Cited

U.S. PATENT DOCUMENTS

| | | | |
|---|---|---|---|
| 6,567,175 B1 * | 5/2003 | Lee | ............................ 358/1.14 |
| 6,854,112 B2 * | 2/2005 | Crespo et al. | ................ 717/174 |
| 6,892,299 B2 * | 5/2005 | Abe | ................................ 713/2 |
| 2002/0067504 A1 * | 6/2002 | Salgado et al. | .............. 358/1.15 |
| 2003/0066066 A1 * | 4/2003 | Nguyen et al. | ............... 717/178 |
| 2003/0231333 A1 * | 12/2003 | Nakamura et al. | .......... 358/1.14 |
| 2004/0061894 A1 * | 4/2004 | Yoshida et al. | .............. 358/1.15 |
| 2005/0200880 A1 * | 9/2005 | Oshiumi et al. | ............. 358/1.14 |

FOREIGN PATENT DOCUMENTS

| | | | | |
|---|---|---|---|---|
| JP | 2002-027940 | * | 1/2001 | ....................... 3/12 |
| JP | 2002-196906 | * | 7/2002 | ....................... 3/12 |

* cited by examiner

*Primary Examiner*—Tammara Peyton
(74) *Attorney, Agent, or Firm*—Fitzpatrick, Cella, Harper & Scinto

(57) ABSTRACT

A peripheral apparatus reserves and stores, on a nonvolatile storage medium, a first storage area which stores a control program for implementing a function of the peripheral apparatus, and a second storage area which stores a rewrite program for rewriting the control program. The firmware is formed from at least the control program and the rewrite program. When selectively switching and controlling a first mode for updating the firmware of the rewrite program, and a second mode for executing the control program, the first mode receives updating data of the control program from an external apparatus, rewrites the control program stored in the first storage area to updating data, using the rewrite program, determines that a rewrite operation is normally ended, and performs the rewrite operation again when the rewrite operation is not normally ended.

9 Claims, 5 Drawing Sheets

PERIPHERAL APPARATUS, FIRMWARE UPDATING METHOD THEREOF FOR DETERMINING WHETHER AN ERROR HAS OCCURRED DURING THE INSTALLATION OF A REWRITE OPERATION

FIELD OF THE INVENTION

The present invention relates to a peripheral apparatus which controls the apparatus itself on the basis of firmware, a firmware updating method of the peripheral apparatus, and a program.

BACKGROUND OF THE INVENTION

Conventionally, a printing apparatus which prints characters or images on a printing medium such as a sheet material (e.g., printing paper and a thin plastic plate), and recently a CD (medium to be printed) has been known. In this printing apparatus, a microprocessing unit (MPU) incorporated in the printing apparatus to control the printing apparatus analyzes reception data from a host computer connected to the printing apparatus, and executes a printer control program which implements printer engine control and the like (e.g., convey of a printing medium, and control of a printhead).

A program indicating the control sequence of this MPU is stored in a nonvolatile EPROM or mask ROM. Hardware is used for the engine control such as generation of a driving pulse for the printhead, and various logic units for generation of print data and the like. Recently, a gate array on which these logic portions are integrated in one LSI is generally used.

However, in the above-described conventional printing apparatus, the contents of an EPROM or mask ROM which stores the printer control program are not rewritten on the user side. Hence, when the printer control program needs to be updated in accordance with upgrading, the existing nonvolatile EPROM or mask ROM incorporated in the printing apparatus is changed to a nonvolatile EPROM or mask ROM which stores a new printer control program, thereby updating the printer control program.

Generally, such nonvolatile EPROM or mask ROM is not easily replaced, and this replacement is done by a serviceman, or by carrying the apparatus body in a service center.

For example, according to one method for updating the printer control programs, a flash memory stores the printer control program for the printing apparatus, and a ROM independently incorporated in the printing apparatus stores a rewrite program for the flash memory. When the printer control program needs to be updated, a new printer control program is received from the host computer, and the printer control program in the flash memory is updated to the received program data by the rewrite program stored in the ROM.

Generally, since firmware such as the printer control program is updated by rewriting the contents of the flash memory or EEPROM which stores the firmware, the contents of the firmware before the rewrite is erased. Therefore, when the program data used for updating is failed, or when the rewrite operation is failed because of power-off, contact failure of a cable, noise, and the like during rewriting the firmware, there are risks that the firmware becomes illicit, and an end user cannot cope with the failure.

That is, such firmware updating process requires a special operation which is unfamiliar to the user. Also, when the rewrite operation is failed, the user must bear the risk of a failure with which the user cannot cope.

Alternatively, assume that firmware programs of a plurality of the printing apparatuses are rewritten by one host computer which can transmit new firmware, for example, that the ROM contents need to be rewritten during the manufacture of products in a factory, and that the ROM contents are rewritten in the service center after the manufacture. Whenever the printing apparatus is set in the download mode to rewrite the firmware, and connected to the host computer, a new printer is registered to the host computer. As a result, the operation speed of the host computer becomes low, and sometimes, the user cannot recognize which printer of the registered printers is currently used.

As described above, when one host computer rewrites the firmware programs of the plurality of printing apparatuses in the factory or service center, the larger the number of printing apparatuses which rewrite the firmware, the larger the number of extra printers registered in the host computer, thereby particularly degrading the efficiency.

SUMMARY OF THE INVENTION

The present invention has been made to solve the above problems, and has as its object to provide a peripheral apparatus which can update firmware properly and reliably, a firmware updating method of the peripheral apparatus, and a program.

According the present invention, the foregoing object is attained by providing a peripheral apparatus which controls the apparatus itself on the basis of firmware, comprising storage means for reserving and storing, on a nonvolatile storage medium, a first storage area which stores a control program for implementing a function of the peripheral apparatus, and a second storage area which stores a rewrite program for rewriting the control program, the firmware being formed from at least the control program and the rewrite program, and control means for selectively switching and controlling a first mode for updating the firmware by the rewrite program, and a second mode for executing the control program, the first mode comprising reception means for receiving updating data of the control program from an external apparatus, rewrite means for rewriting the control program stored in the first storage area to updating data received by the reception means, using the rewrite program, determination means for determining that a rewrite operation executed by the rewrite means is normally ended, and rewrite control means for performing the rewrite operation again by the rewrite means when the rewrite operation is not normally ended as a result of the determination of the determination means.

In a preferred embodiment, the apparatus further comprises output means for outputting a rewrite status obtained by the rewrite means.

In a preferred embodiment, the determination means determines whether the control program stored in the second storage area is normal, before the mode of the apparatus is shifted from the first mode to the second mode, and the rewrite control means performs the rewrite operation again by the rewrite means when the control program is not normally ended as a result of the determination of the determination means.

In a preferred embodiment, the first mode further comprises check means for checking a presence/absence of abnormality of the nonvolatile storage medium, and notification means for notifying a user that the first storage area has an abnormality checked by the check means.

In a preferred embodiment, the apparatus further comprises transmission means for transmitting a process status of the first mode to the external apparatus.

In a preferred embodiment, the first mode further comprises, in a storage medium other than the nonvolatile storage medium, rewrite status information storage means for storing rewrite status information indicating the rewrite status acquired by the rewrite means, and after the rewrite operation executed by the rewrite means is interrupted, when the rewrite operation is to be started again, the rewrite control means rewrites only unrewritten updating data with reference to the rewrite status information stored in the storage medium just before the interruption.

In a preferred embodiment, the apparatus further comprises first operation means for setting the first mode, and second operation means for turning on/off the peripheral apparatus, wherein the control means sets a flag indicating whether apparatus information which specifies the peripheral apparatus is output to the external apparatus.

In a preferred embodiment, the peripheral apparatus comprises a printing apparatus which prints an image on the printing medium, and the control program includes a program which controls an operation of the printing apparatus.

According to the present invention, the foregoing object is attained by providing a firmware updating method of a peripheral apparatus which reserves a first storage area which stores a control program for implementing a function of the peripheral apparatus, and a second storage area which stores a rewrite program for rewriting the control program, the firmware being formed from at least the control program and the rewrite program, comprising a reception step of receiving updating data of the control program from an external apparatus, a rewrite step of rewriting the control program stored in the first storage area to updating data received in the reception step, using the rewrite program, a determination step of determining that a rewrite operation executed in the rewrite step is normally ended, and a rewrite control step of performing the rewrite operation again in the rewrite step when the rewrite operation is not normally ended as a result of the determination in the determination step.

According to the present invention, the foregoing object is attained by providing a program of updating firmware of a peripheral apparatus which reserves a first storage area which stores a control program for implementing a function of the peripheral apparatus, and a second storage area which stores a rewrite program for rewriting the control program, the firmware being formed from at least the control program and the rewrite program, comprising a program code of the reception step of receiving updating data of the control program from an external apparatus, a program code of the rewrite step of rewriting the control program stored in the first storage area to updating data received in the reception step, using the rewrite program, a program code of the determination step of determining that a rewrite operation executed in the rewrite step is normally ended, and a program code of the rewrite control step of rewriting again in the rewrite step when the rewrite operation is not normally ended as a result of the determination in the determination step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENT

A preferred embodiment of the present invention will be described in detail in accordance with the accompanying drawings.

More specifically, in an embodiment, a printing apparatus will be described as an example.

The characteristic feature according to this embodiment of the present invention resides in the following functions.

First, programs which respectively implement a user mode set as a general printing apparatus, and a download mode which is a firmware rewrite mode are stored in separate sections in one rewritable nonvolatile memory. When an AC/DC power supply is connected to the apparatus, the download mode is set to completely rewrite the firmware. After that, it is checked whether the rewrite operation is normally ended. When the rewrite operation is not normally ended, the printing apparatus is automatically reactivated in the download mode.

When the printing apparatus is activated in the user mode, the nonvolatile memory is also checked. When an abnormality is detected, the printing apparatus is automatically reactivated in the download mode.

The nonvolatile memory is separately checked in a storage area which stores a user mode program, and a storage area which stores a download mode program. When an abnormality is detected in the storage area which stores the user mode program, the printing apparatus is automatically reactivated in the download mode. Alternatively, when an abnormality is detected in the storage area which stores the download mode program, the printing apparatus notifies the user of the ROM error on a display such as an LCD or LED of the printing apparatus.

In addition to a host computer→printing apparatus system which receives the updating firmware via an interface establishing connection with the host computer, a connection is established in a host computer←printing apparatus system. This system notifies the user of a rewrite status of the firmware. Also, when the program corresponding to the download mode of the firmware of the printing apparatus has been installed to the host computer, the rewrite status of firmware is displayed on the display of the host computer.

In addition to the nonvolatile memory for storing the programs corresponding to the user mode and the download mode respectively, the firmware is rewritten while sequentially printing, on the rewritable nonvolatile memory, information associated with the rewrite status of firmware in the download mode (for example, a file name used for rewriting, and a number of section which has been rewritten).

When setting the download mode, the printing apparatus detects whether a predetermined external key is pressed, and determines whether apparatus information (serial number) for specifying the apparatus is supported on the basis of the detection result.

A specific arrangement for implementing the above various characteristic features will be described below.

Figure 1:
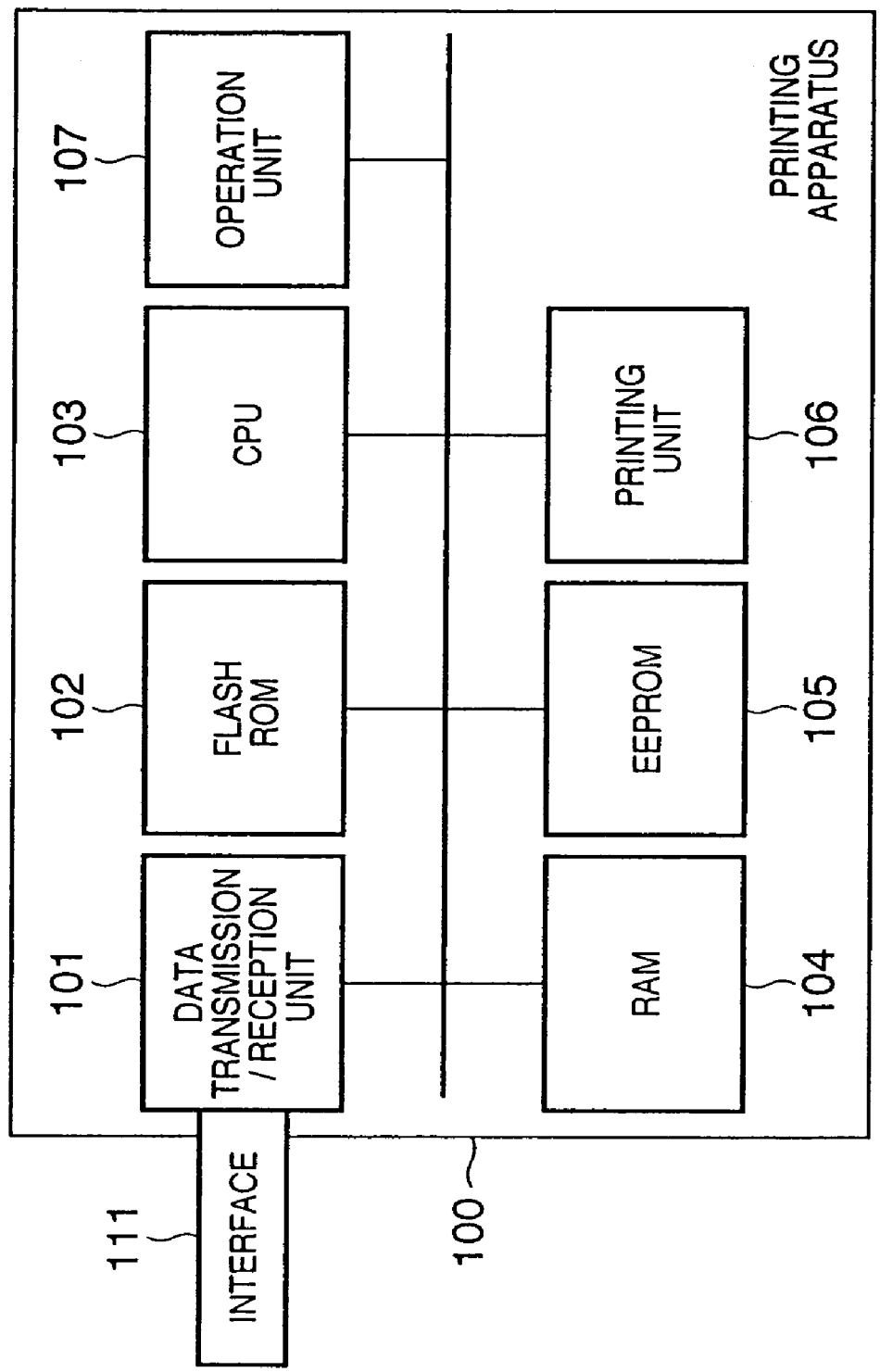
FIG. 1 is a block diagram showing the arrangement of a printing apparatus according to an embodiment of the present invention.

FIG. 1 is a block diagram showing the arrangement of the printing apparatus according to the embodiment of the present invention.

Reference numeral 100 denotes a printing apparatus. As a print scheme of the printing apparatus 100, for example, the present invention can be applied to various schemes such as inkjet scheme, laser beam scheme, and thermal transfer scheme. In this embodiment, the ink-jet scheme printing apparatus will be described as an example.

Reference numeral 101 denotes a data transmission/reception unit which transmits/receives data to/from an external apparatus (e.g., host computer) via a physical interface 111. Note that, for example, the physical interface 111 employs a USB 2.0 FulllSpeed upstream port in this embodiment. However, the present invention is not limited to this. The interface of the other standards, e.g., the USB 1.0, IEEE1394, wireless LAN, and Bluetooth may be employed. In addition to this interface 111, the printing apparatus may have a network interface for connecting to the LAN and the like.

Reference numeral 102 denotes a flash ROM of a rewritable nonvolatile memory, which stores various control programs, data, font data, and tables for operating the printing apparatus 100. Reference numeral 103 denotes a CPU which controls various motors, carriages, ASFs, and the like for printing data on the printing medium on the basis of the print data.

Reference numeral 104 denotes a RAM which functions as a storage area and a work area for temporally loading data when receiving the data or executing the program. Reference numeral 105 denotes an EEPROM which stores, for example, print information associated with the last print time and the error logging of the printing apparatus 100, and shipment setting information which is a serial number uniquely added to the apparatus and initial setting information when shipping. Reference numeral 106 denotes a printing unit which includes a printing mechanism, a feeding or discharging mechanism, a convey mechanism, and a motor. The printing mechanism includes a printhead for printing an image based on the print data on the printing medium, a carriage for scanning the printhead, and the like. The feeding or discharging mechanism feeds or discharges the printing medium. The convey mechanism conveys the printing medium. The motor drives these mechanisms.

Reference numeral 107 denotes an operation unit which includes various operation buttons such as a power button, and a notification unit for notifying the user of various states of the printing apparatus 100 using an LED, LCD, or the like.

Next, the outer appearance of the printing apparatus 100 will be described with reference to FIG. 2.

Figure 2:
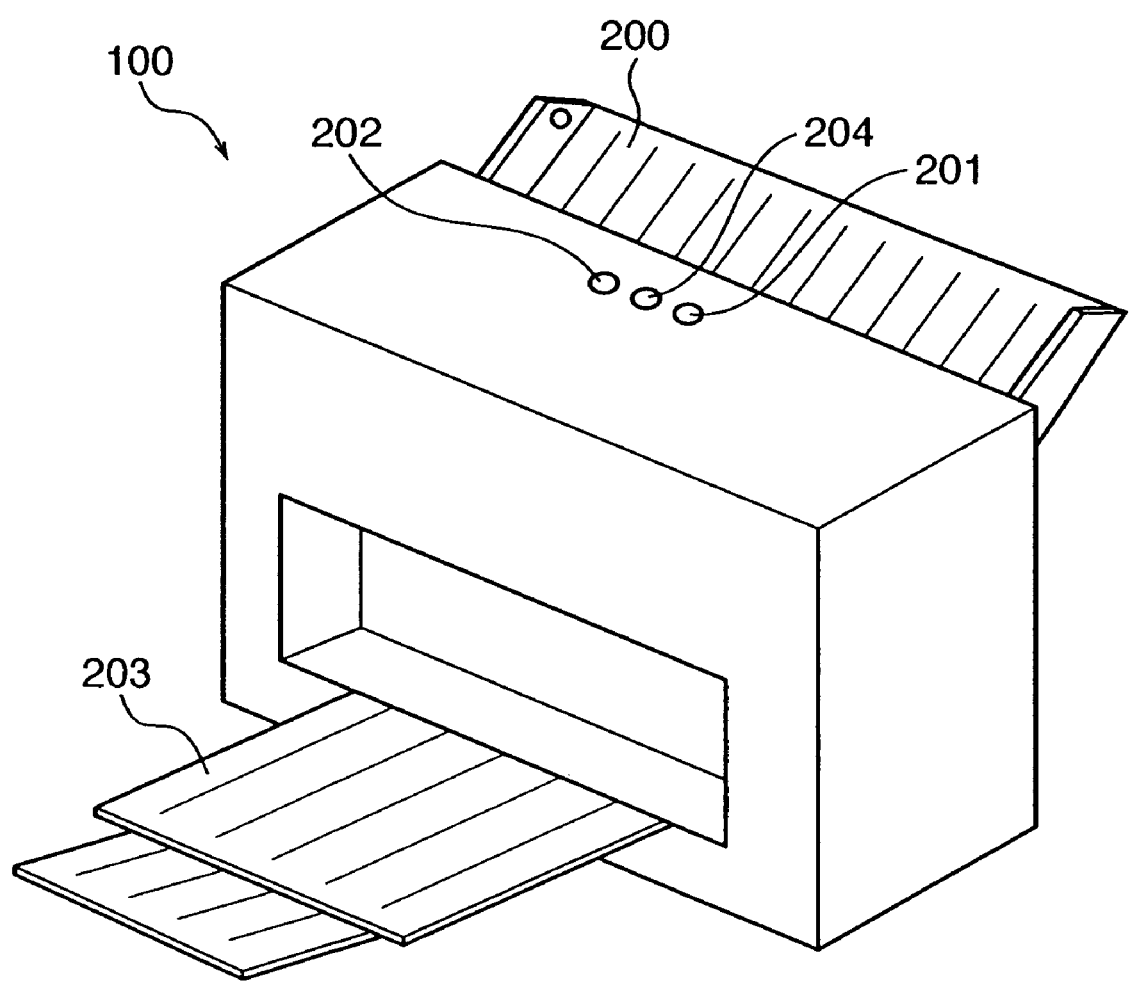
FIG. 2 is a perspective view showing the outer appearance of the printing apparatus according to the embodiment of the present invention.

FIG. 2 is a perspective view showing the outer appearance of the printing apparatus according to the embodiment of the present invention.

Reference numeral 200 denotes a paper feed tray which feeds the printing medium to the printing apparatus 100. Reference numeral 201 denotes a power button. The printing apparatus 100 can be turned on/off by pressing this power button 201. Reference numeral 202 denotes a "continue" button for an error return when an error occurs. Reference numeral 203 denotes a paper discharge tray which receives a printed printing medium when the printing medium is discharged. Reference numeral 204 denotes an LED which is turned on to notify the user of the ON/OFF state of the printing apparatus, and an abnormal state. In this embodiment, this LED 204 can be turned on in green or orange.

Next, the arrangement of the storage area of the flash ROM 102 will be described with reference to FIG. 3.

Figure 3:
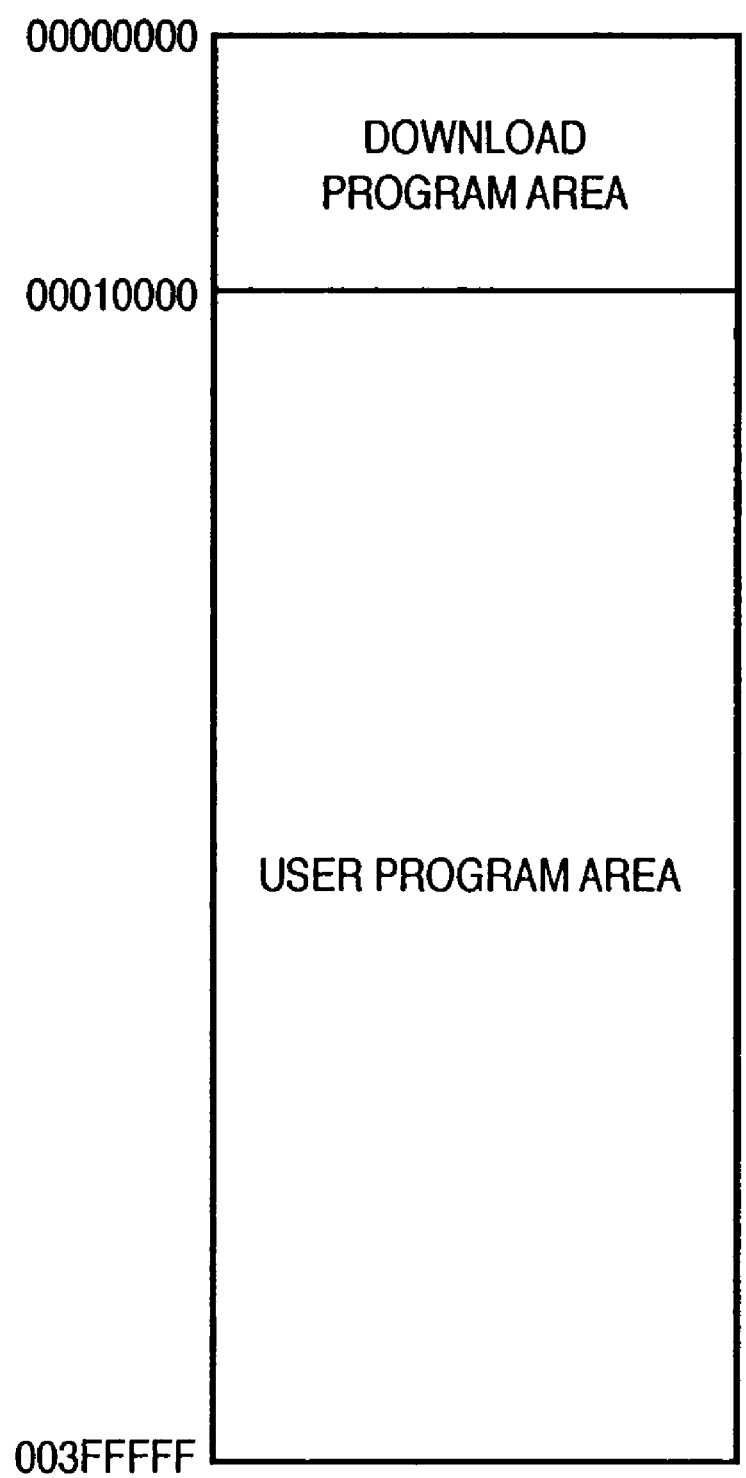
FIG. 3 is a view showing the memory map of a storage area of a flash ROM according to the embodiment of the present invention.

FIG. 3 shows the arrangement of a storage area of a flash ROM according to the embodiment of the present invention.

In this embodiment, a download program area which stores the rewrite program for rewriting a user program area is reserved in the storage areas from start address 0000000000 to address 0x0000FFFF in the flash ROM 102.

Note that, this rewrite program indicates the program which receives the data for rewriting the user program area from the external unit (host computer in this embodiment), and implements various processes (flash ROM rewrite routine to be described later) required until the firmware is actually rewritten.

In the storage areas from address 0x00010000 to address 0x003FFFFF, the user program area which stores the control program (interpreter, rasterizer, renderer, and the like) for implementing the function of the printing apparatus 100 is generally reserved. In each storage area, 16-bit checksum data is so stored as to make the checksum value become zero.

Note that in this embodiment, the program and data stored in the flash ROM 102 are firmware for the printing apparatus 100. This firmware includes the rewrite program in the download program area, and the various programs in the user program area.

Next, the process executed by the printing apparatus of this embodiment will be described with reference to FIG. 4.

Figure 4:
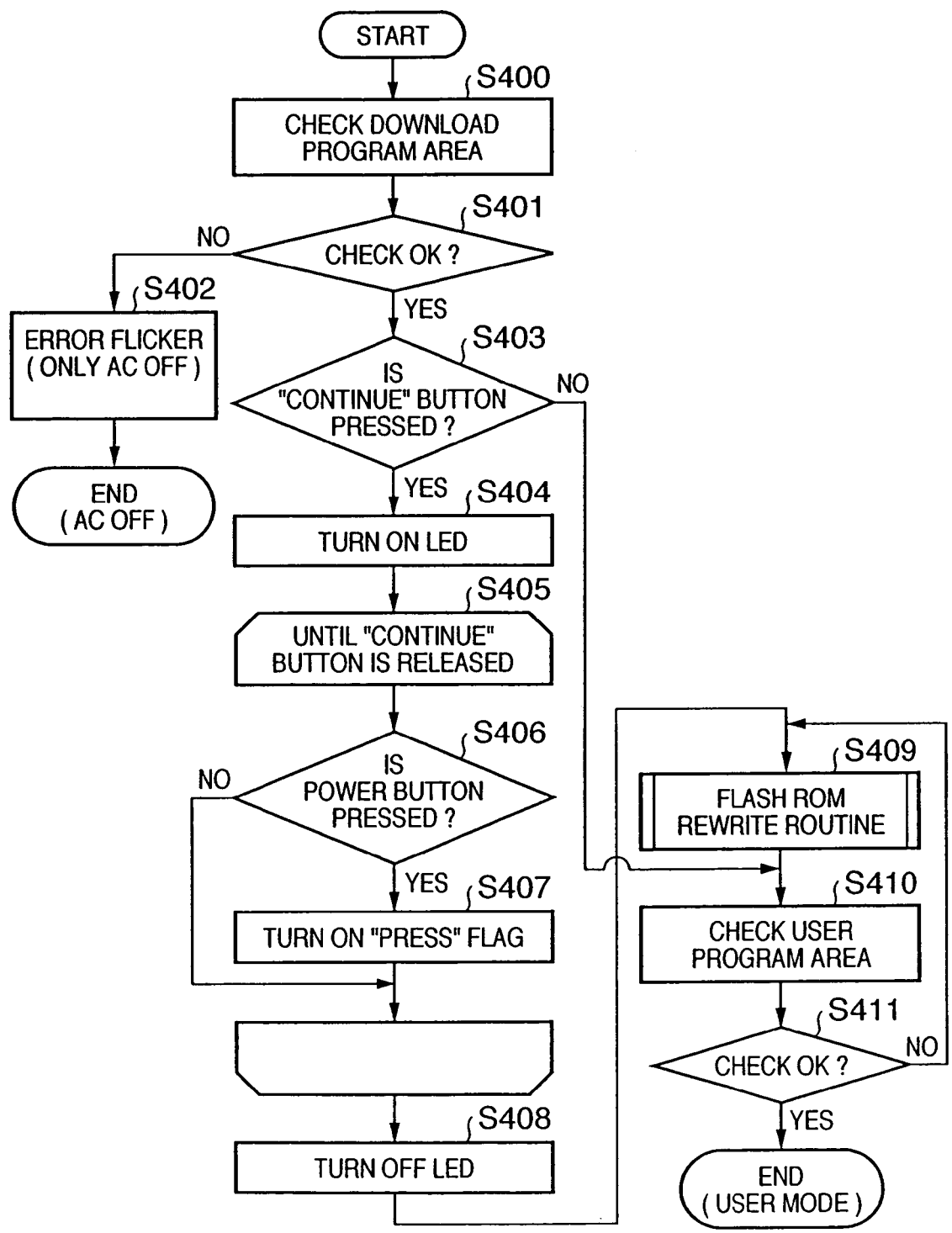
FIG. 4 is a flowchart showing a process executed by the printing apparatus according to the embodiment of the present invention.

FIG. 4 is a flowchart showing a process executed by the printing apparatus according to the embodiment of the present invention.

Note that in the process shown in FIG. 4, two kinds of modes, i.e., the download mode for updating the firmware, and the user mode used as the general printing apparatus by the user are provided.

The download mode is a mode for executing (activating) the rewrite program in the download program area of the flash ROM 102, and rewriting the user program area in the state when the printing apparatus 100 is set in an AC-ON state, and the power button of the printing apparatus 100 is not turned on (that is, the printing apparatus 100 is not turned on because the power button 201 is not pressed). In this process, the AC-ON state is an energizing state in which the printing apparatus 100 and the external power supply (AC or DC power supply) are connected, and the printing apparatus 100 is turned on as long as the power button 201 is pressed.

Alternatively, the user mode is a mode for executing (activating) the control program in the user program area of the flash ROM 102 after the printing apparatus 100 is turned on by pressing the power button 201.

Processes will be described below in detail with reference to FIG. 4.

When the printing apparatus 100 is set in the AC-ON state, the 16-bit checksum data in the download program area is checked in step S400. As shown in FIG. 3, since the checksum value is stored to be "0" in the download program area, it is checked whether the checksum value is zero. In addition to this, the connection of the flash ROM 102 may be checked.

When the checksum value is not "0" in step S401 (NO in step S401), the flow advances to step S402 to execute the error/toggle flicker of the LED 204 in orange and green alternatively as an error indicating that the abnormality occurs in the flash ROM 102.

Note that in this case, the download program area may be broken at a high probability. Hence, the LED 204 may not even flicker. Only in this case, the user calls a serviceman to request to inspect the printing apparatus, or carries the printing apparatus to a repair service center to request to inspect the printing apparatus. Alternatively, in other cases, the user can recognize the abnormality of the flash ROM 102 by this error/toggle flicker, and the user can repair the abnormal flash ROM 102 by him/herself.

When the checksum value becomes "0" in step S401 (YES in step S401), it is determined that the program in the download program area is normally stored. The flow advances to step S403.

In step S403, it is determined whether the "continue" button 202 is pressed. When the "continue" button 202 is not pressed (NO in step S403), the flow advances to step S410.

In step S410, the 16-bit checksum data in the user program area, i.e., the area from address 0x00010000 to address 0x00400000 is checked. Since the checksum value is also set to be "0" in the user program area, it is checked whether the checksum value is "0". In addition to this, the connection of the flash ROM 102 may be checked.

When the checksum value is not "0" in step S411 (NO in step S411), there is a risk that the user program area is broken for some reason. Hence, the flow advances to step S409, and the mode is shifted to the download mode (flash ROM rewrite routine) in order to rewrite the user program area.

When the checksum value is "0" (YES in step S411), the download mode is ended and becomes a soft power-off state of the user mode, i.e., a status to wait for pressing the power button 201.

When the "continue" button 202 is pressed in step S403 (YES in step S403), the LED 204 is turned on in green in step S404 in order to indicate that the printing apparatus is set in the download mode. After that, the sequence loops until the "continue" button 202 is released in step S405, and it is determined in step S406 that the power button 201 is pressed.

When the power button 201 is pressed (YES in step S406), the flow advances to step S407. A "press" flag indicating that the power button 201 is pressed is turned on to store the "press" flag in the RAM 104.

Note that, the default setting of this "press" flag is set as "OFF", and set as "ON" when the power button 201 is pressed. Then, in accordance with the ON/OFF state of the "press" flag, it is determined whether USB descriptor information is replied to the host computer. Therefore, this "press" flag is understood as presence/absence information indicating the presence/absence of the serial number of a unique apparatus, which is one piece of descriptor information.

As described above, when the "continue" button 202 is pressed to set the download mode, the power button 201 switches the presence/absence of the serial number. Hence, when rewriting the flash ROM with a large capacity in a factory, service center, or the like, registration of many unnecessary printers in the host computer can be avoided.

Alternatively, when the power button 201 is not pressed until the "continue" button 202 is released (NO in step S406), the flow advances to step S408. In this case, when the USB descriptor information is generated in the flash ROM rewrite routine in step S409 to be described later, the printing apparatus accesses the EEPROM 105. Then, the serial number used in the user mode is acquired to be replied to the host computer.

After that, in step S408, the LED 204 is temporarily turned off. Next, in step S409, the flash ROM rewrite routine is executed. Note that the flash ROM rewrite routine will be described in detail with reference to FIG. 5.

When the process in step S409 is ended, the flow advances to step S410 to check the 16-bit checksum data in the user program area. Then, in the step S411, when the checksum value is "0" (YES in step S411), the download mode is ended to shift to the user mode. Alternatively, when the checksum value is not "0" (NO in step S411), the download is not normally ended. Hence, the flow returns to step S409 to execute the flash ROM rewrite routine again.

As described above, in this embodiment, when the download mode is set to rewrite the flash ROM 102, the user mode is controlled not to be set until the download is normally executed even if the rewrite operation is failed.

Next, the flash ROM rewrite routine in step S408 shown in FIG. 4 will be described in detail with reference to FIG. 5.

Figure 5:
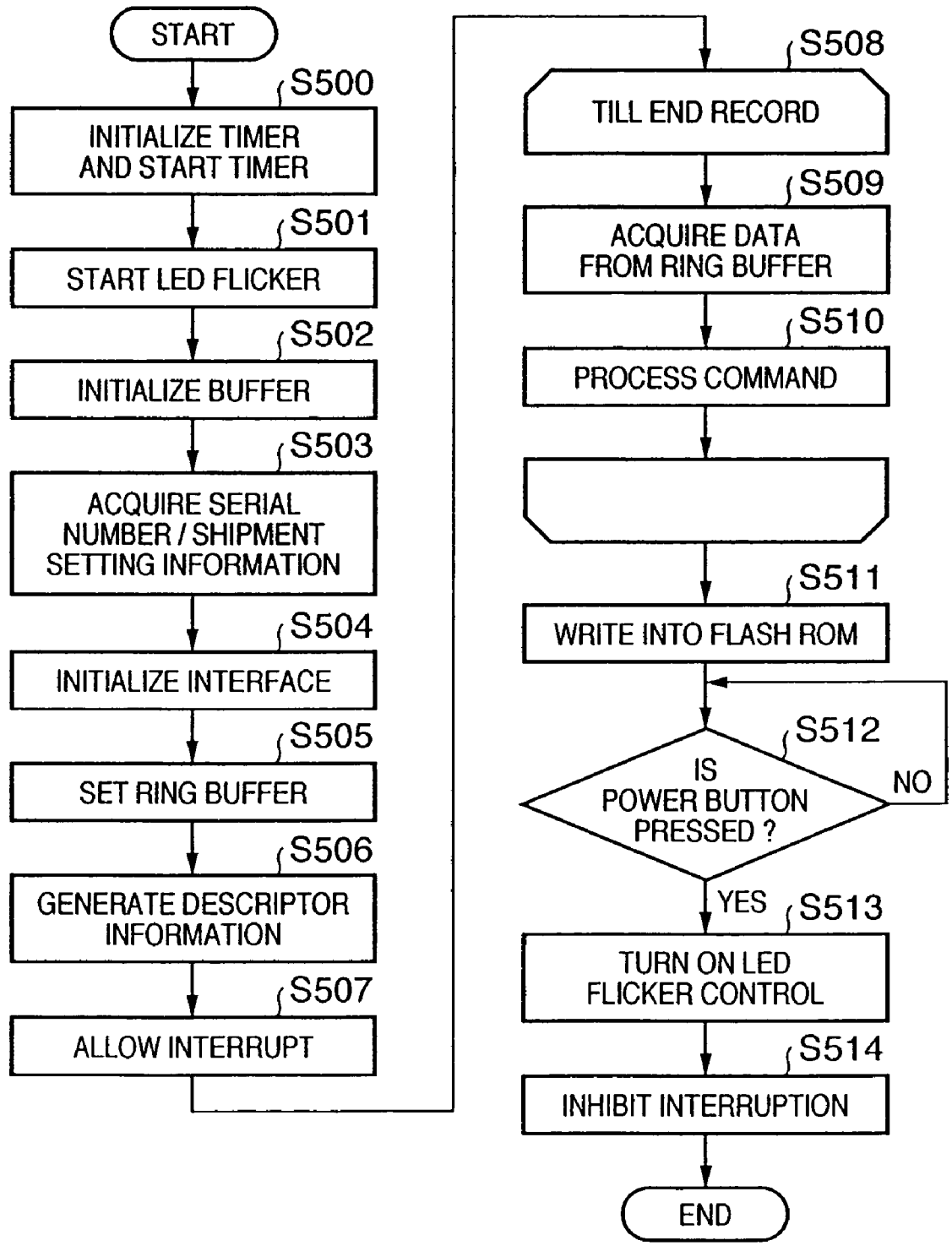
FIG. 5 is a flowchart showing a flash ROM rewrite routine in detail according to the embodiment of the present invention.

FIG. 5 is a flowchart showing a flash ROM rewrite routine in detail according to this embodiment of the present invention.

In step S500, the timer for controlling the flicker of the LED 204 is initialized, and the timer starts to measure the time.

Note that, this timer may be a software timer implemented by the CPU 103 or a hardware timer. In this embodiment, the timer cycle is 500 μsec. Then, the timer sequentially acquires the time, measures the elapsed time, and controls the flicker of the LED 204.

More specifically, an LED flicker cycle control function for executing the LED flicker control is generated. This function is invoked during a time-consuming process or relatively free time, so that the timer recognizes the time, compares the time with the LED flicker cycle, and performs ON/OFF operation when the time exceeds the flicker cycle.

In step S501, the flicker cycle of the LED 204 is stored in the RAM 104 as global data. On the basis of this global data, the LED 204 starts to flicker. More specifically, in this embodiment, global data of this flicker cycle is rewritten to change the flicker cycle when the error occurs, and the download data is started to be received.

In step S502, on the basis of the download data (updating data) for rewriting the user program area received from the host computer, the printing apparatus generates an actual ROM image to be written in the download program area, and fills the buffer for storing the ROM image with 0xFF to initialize the buffer. In this process, since 0xFF is written in the buffer to be reserved in the RAM 104 by the loop, the LED flicker cycle control function is invoked in the loop to avoid an irregular flicker cycle of the LED 204.

In step S503, the serial number/shipment setting information used in the user mode is obtained from the EEPROM 105. In this process, since a read process of the EEPROM 105 is also time-consuming, the LED flicker cycle control function is invoked at a right position to avoid an irregular LED flicker cycle.

In step S504, the interface 111 is initialized. More specifically, the register of Endpoint 0, 1, and 2 used in the USB is initialized.

In step S505, a ring buffer for storing the download data received from the host computer is initialized. For example, this ring buffer is reserved in the RAM 104.

In step S506, a model name indicating a kind of the printing apparatus 100 is generated from the contents (ON/OFF) of the "press" flag stored in the RAM 104, and the serial number/shipment setting information obtained in step S503, thereby generating descriptor information for establishing the connection with the host computer. Since this process is also time-consuming, the LED flicker cycle control function is invoked at a right position to avoid an irregular flicker of the LED 204.

In step S507, an interrupt associated with the USB is allowed to wait for the connection establishment and the transmission of data from the host computer.

In step S508, the sequence loops. In step S509, the LED flicker cycle control function is invoked while acquiring the download data from the ring buffer, to flicker the LED. When the download data can be obtained from the ring buffer in step S509, the command is sequentially processed, and a ROM image is generated in the buffer on the RAM 104 in step S510 on the basis of the Motorola S-format used in this embodiment.

When the download data has been acquired from the ring buffer, the ROM image on the buffer is rewritten in the flash ROM 102 in step S511. Since the rewrite operation of the ROM image to the flash ROM 102 is also time-consuming, the LED flicker cycle control function is invoked at the right position to avoid the irregular flicker of the LED 204.

In step S512, the printing apparatus invokes the LED flicker cycle control function, monitors the operation of the power button 201, and determines whether the power button 201 is pressed. When the power button 201 is not pressed (NO in step S512), the sequence waits until the power button 201 is pressed. Alternatively, when the power button 201 is pressed (YES in step S512), the flow advances to step S513, the LED flicker control is ended, and the timer stops.

In step S514, an interrupt is inhibited, and the flash ROM rewrite routine is ended.

When an error occurs in the flash ROM rewrite routine, when the file other than the download data is transmitted from the host computer, or when an error occurs in the command analysis, the global data is changed to invoke the LED flicker cycle control function to implement the error flicker while waiting for pressing the power button 201 in step S512.

In the flash ROM rewrite routine, in order to avoid the shutdown of the power supply of the printing apparatus 100, Device ID which is a printer-class request notifies the user of a progress status of the download, and a progress status of the download mode such as an error status on the host computer side.

The progress and error statuses are displayed on the display of the host computer by a dedicated dialog (e.g., implemented by a printer driver of the printing apparatus 100), thereby notifying the user of the state of the printing apparatus, and attracting an attention in order to avoid the error operation (e.g., shutdown of the power supply in the flash ROM rewrite routine) of the user for the printing apparatus 100.

Note that when rewriting the download data in the flash ROM rewrite routine, the rewrite operation may be executed while managing, in the EEPROM 105 for each sector, the file version and corresponding model of the download data, information for checking whether the pieces of download data of the rewrite original and the rewrite destination are the same, and rewrite status information including information indicating the rewrite status to the flash ROM 102. In this arrangement, when the download operation is failed and tried again, the download operation can be started again from a failed sector (sector which is not completely rewritten). Hence, the time for re-downloading in the failure will be shortened.

In this embodiment, the firmware is updated by downloading the updating firmware from the host computer. However, when the printing apparatus 100 includes the dedicated slot of a removable storage medium such as a memory card slot, and external storage apparatus (hard disk, optical disk driver (CD-ROM/R/RW, DVD-ROM/RAM/RW, and the like), and the like), the storage medium may store the updating firmware, and download the updating firmware from the storage medium to update the firmware. Furthermore, when the printing apparatus 100 includes the network interface, the updating firmware may be downloaded from the device (server and external storage apparatus) on the network to update the firmware.

As described above, in this embodiment, when the power supply cable is disconnected, the download operation is failed by an unexpected accident such as power failure, the flash ROM itself is broken, or the storage medium of the flash ROM is broken in updating the firmware, the firmware is tested to be updated in the download mode, or the error is notified to inhibit shifting the download mode to the user mode.

As a result, for example, even when the user cannot recognize that the printing apparatus is not operated because the storage area of the flash ROM is broken, the mode of the printing apparatus is shifted to the download mode to repair the printing apparatus if the printing apparatus can be repaired by the download operation of the firmware. Hence, even if an accident occurs, the user is not confused, and the user can optimally select the download operation of the firmware for repairing the apparatus.

When shifting to the user mode, the printing apparatus checks the flash ROM. When the error is found, the mode is automatically shifted to the download mode, and the user program area is updated again in the download mode. Therefore, even when the error of the failed download is not found, the printing apparatus can be activated in the download mode. Hence, the abnormal operation of the printer because of the illicit contents of the flash ROM is prevented.

When setting the download mode by pressing the "continue" button, the printing apparatus switches the presence/absence of the notification of the serial number of the apparatus to the host computer. Hence, many unnecessary printers need not be registered in the host computer when the flash ROM with a large capacitor is rewritten in the factory, service center, and the like.

Since the Device ID notifies the host computer of various statuses such as the progress and error of the download, the host computer can display these statuses. Hence, the user can easily check the status of the process associated with the firmware.

In this embodiment, the printing apparatus 100 is described as an example. The present invention can be applied to a facsimile apparatus, copying machine, and the like mounting the printing apparatus 100. Also, the present invention is not limited to this printing apparatus 100. The present invention can be applied to any apparatuses such as a peripheral apparatus (e.g., scanner, digital camera, hub, and router) including a rewritable nonvolatile memory for storing the firmware for controlling the apparatus, and hardware (e.g., motherboard, video card, and SCSI card incorporated in a personal computer and the like).

As described above, this embodiment is explained in detail. The present invention may include an aspect such as a system, apparatus, method, program, or storage medium. More specifically, the present invention may be applied to a system formed from a plurality of devices, or an apparatus formed from one device.

Note that the present invention includes a case wherein the invention is achieved by directly or remotely supplying a program (a program corresponding to the illustrated flowchart in this embodiment) of software that implements the functions of the aforementioned embodiment to a system or apparatus, and reading out and executing the supplied program code by a computer of that system or apparatus.

Therefore, the program code itself installed in a computer to implement the functional process of the present invention using computer implements the present invention. That is, the present invention includes the computer program itself for implementing the functional process of the present invention.

In this case, the form of program is not particularly limited, and an object code, a program to be executed by an interpreter, script data to be supplied to an OS, and the like may be used as along as they have the program function.

As a printing medium for supplying the program, for example, a floppy® disk, hard disk, optical disk, magnetooptical disk, MO, CD-ROM, CD-R, CD-RW, magnetic tape, nonvolatile memory card, ROM, DVD (DVD-ROM, DVD-R), and the like may be used.

As another program supply method, connection may be established to a given home page on the Internet using a browser on a client computer, and the computer program itself of the present invention or a file, which is compressed and includes an automatic installation function, may be downloaded from that home page to a printing medium such as a hard disk or the like, thus supplying the program. Also, program codes that form the program of the present invention may be broken up into a plurality of files, and these files may be downloaded from different home pages. That is, the present invention also includes a WWW server that makes a plurality of users download program files for implementing the functional process of the present invention using a computer.

Also, a storage medium such as a CD-ROM or the like, which stores the encrypted program of the present invention, may be delivered to the user, the user who has cleared a predetermined condition may be allowed to download key information that decrypts the program from a home page via the Internet, and the encrypted program may be executed using that key information to be installed on a computer, thus implementing the present invention.

The functions of the aforementioned embodiments may be implemented not only by executing the readout program code by the computer but also by some or all of actual processing operations executed by an OS or the like running on the computer on the basis of an instruction of that program.

Furthermore, the functions of the aforementioned embodiments may be implemented by some or all of actual processes executed by a CPU or the like arranged in a function extension board or a function extension unit, which is inserted in or connected to the computer, after the program read out from the printing medium is written in a memory of the extension board or unit.

The present invention is not limited to the above embodiments and various changes and modifications can be made within the spirit and scope of the present invention. Therefore, to appraise the public of the scope of the present invention, the following claims are made.

CLAIM OF PRIORITY

This application claims priority from Japanese Patent Application No. 2003-290593 and filed on Aug. 8, 2003, which is hereby incorporated by reference herein.

What is claimed is:

1. A peripheral apparatus which controls itself on the basis of firmware, wherein the firmware is formed from at least a control program and a rewrite program, comprising storage means for reserving and storing, on a nonvolatile storage medium, a first storage area which stores the control program for implementing a function of the peripheral apparatus, and a second storage area which stores the rewrite program for rewriting the control program, and control means for selectively switching and controlling a first mode for updating the firmware by the rewrite program, and a second mode for executing the control program, wherein the first mode comprises reception step for receiving updating data of the control program from an external apparatus, rewrite step for rewriting the control program stored in the first storage area to the updating data received by said reception step, using the rewrite program, determination step for determining whether a rewrite operation executed by said rewrite step has ended normally, and rewrite control step for performing the rewrite operation again by said rewrite step by receiving again the updating data of the control program which failed to rewrite, when said determination step determines that the rewrite operation has not ended normally, wherein the first mode further comprises, in a storage medium, rewrite status information storage step for storing rewrite status information indicating the rewrite status acquired by said rewrite step, and wherein after the rewrite operation executed by said rewrite step is interrupted, when the rewrite operation is to be started again, said rewrite control step rewrites only unrewritten updating data with reference to the rewrite status information stored in the storage medium just before the interruption.

2. The apparatus according to claim 1, further comprising output means for outputting a rewrite status obtained by said rewrite step.

3. The apparatus according to claim 1, wherein said determination step determines whether the control program stored in the second storage area is normal, before the mode of the apparatus is shifted from the first mode to the second mode, and said rewrite control step performs the rewrite operation again by said rewrite step when the control program has not ended normally as a result of the determination of said determination step.

4. The apparatus according to claim 1, wherein the first mode further comprises check step for checking a presence/absence of abnormality of the nonvolatile storage medium, and notification step for notifying a user that the first storage area has an abnormality checked by said check step.

5. The apparatus according to claim 1, further comprising transmission means for transmitting a process status of the first mode to the external apparatus.

6. The apparatus according to claim 1, further comprising first operation means for setting the first mode, and second operation means for turning on/off the peripheral apparatus, wherein said control means sets a flag indicating whether apparatus information which specifies the peripheral apparatus is output to the external apparatus.

7. The apparatus according to claim 1, wherein the peripheral apparatus comprises a printing apparatus which prints an image on the printing medium, and the control program includes a program which controls an operation of the printing apparatus.

8. A firmware updating method of a peripheral apparatus which reserves a first storage area which stores a control program for implementing a function of the peripheral apparatus, and a second storage area which stores a rewrite program for rewriting the control program, wherein the firmware is formed from at least the control program and the rewrite program, comprising
- a reception step of receiving updating data of the control program from an external apparatus,
- a rewrite step of rewriting the control program stored in the first storage area to the updating data received in the reception step, using the rewrite program,
- a determination step of determining whether a rewrite operation executed in the rewrite step has ended normally, and
- a rewrite control step of performing the rewrite operation again in the rewrite step by receiving again the updating data of the control program which failed to rewrite, when said determination step determines that the rewrite operation has not ended normally is not normally,
- wherein a first mode further comprises, in a storage medium, rewrite status information storage step for storing rewrite status information indicating the rewrite status acquired by said rewrite step, and wherein after the rewrite operation executed by said rewrite step is interrupted, when the rewrite operation is to be started again, said rewrite control step rewrites only unrewritten updating data with reference to the rewrite status information stored in the storage medium just before the interruption.

9. A program of updating firmware of a peripheral apparatus which reserves a first storage area which stores a control program for implementing a function of the peripheral apparatus, and a second storage area which stores a rewrite program for rewriting the control program, wherein the firmware is formed from at least the control program and the rewrite program, comprising
- a program code of a reception step of receiving updating data of the control program from an external apparatus,
- a program code of a rewrite step of rewriting the control program stored in the first storage area to the updating data received in the reception step, using the rewrite program,
- a program code of a determination step of determining whether that a rewrite operation executed in the rewrite step has ended normally, and
- a program code of a rewrite control step of rewriting again in the rewrite step by receiving again the updating data of the control program which failed to rewrite, when said determination step determines that the rewrite operation has not ended normally is not normally ended,
- wherein a first mode further comprises, in a storage medium, rewrite status information storage step for storing rewrite status information indicating the rewrite status acquired by said rewrite step, and wherein after the rewrite operation executed by said rewrite step is interrupted, when the rewrite operation is to be started again, said rewrite control step rewrites only unrewritten updating data with reference to the rewrite status information stored in the storage medium just before the interruption.

* * * * *

UNITED STATES PATENT AND TRADEMARK OFFICE
CERTIFICATE OF CORRECTION

PATENT NO. : 7,398,331 B2  Page 1 of 1
APPLICATION NO. : 10/900171
DATED : July 8, 2008
INVENTOR(S) : Naoki Aoyama It is certified that error appears in the above-identified patent and that said Letters Patent is hereby corrected as shown below:

<u>COLUMN 13</u>:
      Line 20, "normally is not normally," should read -- normally, --.

<u>COLUMN 14</u>:
      Line 13, "that" should be deleted; and
      Line 19, "normally is not normally ended," should read -- normally, --.

Signed and Sealed this

Twenty-fourth Day of February, 2009

JOHN DOLL
*Acting Director of the United States Patent and Trademark Office*